(12) United States Patent
McLachlan et al.

(10) Patent No.: US 8,089,380 B2
(45) Date of Patent: Jan. 3, 2012

(54) VOLTAGE MODE DAC WITH CALIBRATION CIRCUIT USING CURRENT MODE DAC AND ROM LOOKUP

(75) Inventors: Roderick McLachlan, Edinburgh (GB); Samuel Blackburn, Edinburgh (GB)

(73) Assignee: Analog Devices, Inc., Norwood, MA (US)

( * ) Notice: Subject to any disclaimer, the term of this patent is extended or adjusted under 35 U.S.C. 154(b) by 327 days.

(21) Appl. No.: 12/603,883

(22) Filed: Oct. 22, 2009

(65) Prior Publication Data

US 2011/0037630 A1 Feb. 17, 2011

Related U.S. Application Data

(60) Provisional application No. 61/234,436, filed on Aug. 17, 2009.

(51) Int. Cl.
*H03M 1/10* (2006.01)
(52) U.S. Cl. .......................................... 341/120; 341/118
(58) Field of Classification Search .................. 341/120, 341/118, 144, 141, 139, 143, 121, 122, 156, 341/161, 136, 145; 327/103
See application file for complete search history.

(56) References Cited

U.S. PATENT DOCUMENTS

| | | | |
|---|---|---|---|
| 2002/0197975 A1* | 12/2002 | Chen | 455/324 |
| 2005/0001747 A1 | 1/2005 | Kuyel et al. | |
| 2006/0276982 A1 | 12/2006 | Caffrey et al. | |
| 2007/0103350 A1 | 5/2007 | Hsu et al. | |

OTHER PUBLICATIONS

PCT International Search Report and Written Opinion for PCT/US10/44956 mailed on Oct. 13, 2010.

* cited by examiner

*Primary Examiner* — Joseph Lauture
(74) *Attorney, Agent, or Firm* — Kenyon & Kenyon LLP

(57) ABSTRACT

The invention is a novel scheme of calibrating a voltage-mode digital to analog converter using a current-mode digital to analog converter. A DAC system is comprised of a voltage-mode DAC with an R-2R architecture structure and includes a ROM lookup table where calibration codes associated with each of a plurality of input codes are stored. A reference current is scaled with the calibration codes to output a calibration current that induces adjustments in an output voltage to counteract non-linearities that may be induced by resistor mismatch.

27 Claims, 3 Drawing Sheets

100

200

300

VOLTAGE MODE DAC WITH CALIBRATION CIRCUIT USING CURRENT MODE DAC AND ROM LOOKUP

CROSS-REFERENCE TO RELATED APPLICATIONS

This application claims priority to U.S. Provisional Patent Application No. 61/234,436, filed on Aug. 17, 2009, entitled "Voltage Mode DAC with Calibration Circuit Using Current Mode DAC and ROM Lookup," which is herein incorporated by reference in its entirety.

FIELD OF INVENTION

The present invention relates to the method of calibrating a voltage-mode digital to analog converter using a current-mode digital to analog converter. The present invention further relates to the design of a calibration circuit for a voltage-mode digital to analog convert with a segmented R-2R resistor ladder structure using a current-mode digital to analog converter and a ROM lookup table.

BACKGROUND OF INVENTION

High precision, large bit digital to analog converters ("DACs") often use segmented resistor architectures, "R-2R" architectures, or hybrid architectures. In each architecture, the DAC is populated by an array of switch-controlled resistor segments that are individually switched to a high reference voltage ("$V_{HI}$") or to a low reference voltage ("$V_{LO}$") in response to a digital input code. When such DACs are manufactured in integrated circuits, mismatch among the different resistors can lead to non-linear behavior and, therefore, loss of precision.

Previous attempts to address these issues have primarily focused on trimming or similar methods. Laser trimming allows for the adjustment of the resistors to more ideal values with a much lower tolerance. This method however, is largely impractical, inefficient, and costly to perform on a continuing basis. Other attempts have addressed the modification of the R-2R ladder by removing and scaling resistors in paths corresponding to the least significant bits ("LSBs"). Such methods however, require the use of long resistor units, and thus the amount of time it takes the signal to reach the output differs among the paths, resulting in glitches at the output.

There is a need in the art for a high precision, large bit DAC architecture that retains precision even in the presence of resistor mismatch. The present disclosure is directed to such needs.

DETAILED DESCRIPTION

Non-linearities in voltage mode DACs may be overcome by a DAC system that introduces a calibration current into a predetermined branch of the voltage mode DAC. Embodiments of the present invention provide for propagating the calibration current through the DAC branch and inducing adjustments in an output voltage $V_{OUT}$ that counteract non-linearities that may be induced by resistor mismatch. The calibration current may vary based on a digital code input to the system. The DAC system may include a current generator that includes a current mode DAC controlled by a calibration code generator. The calibration code generator may include a memory array that stores calibration codes associated with each of a plurality of input codes.

When the DAC system is manufactured as an integrated circuit, the system may be tested for non-linear behavior. Calibration codes may be derived and stored to the memory array to counteract the observed non-linear behavior. For example, the calibration codes may be burned to non-volatile memory. In this manner, non-linear behavior may be corrected even when such non-linearities vary across manufacturing lots of a common circuit system.

Figure 1:
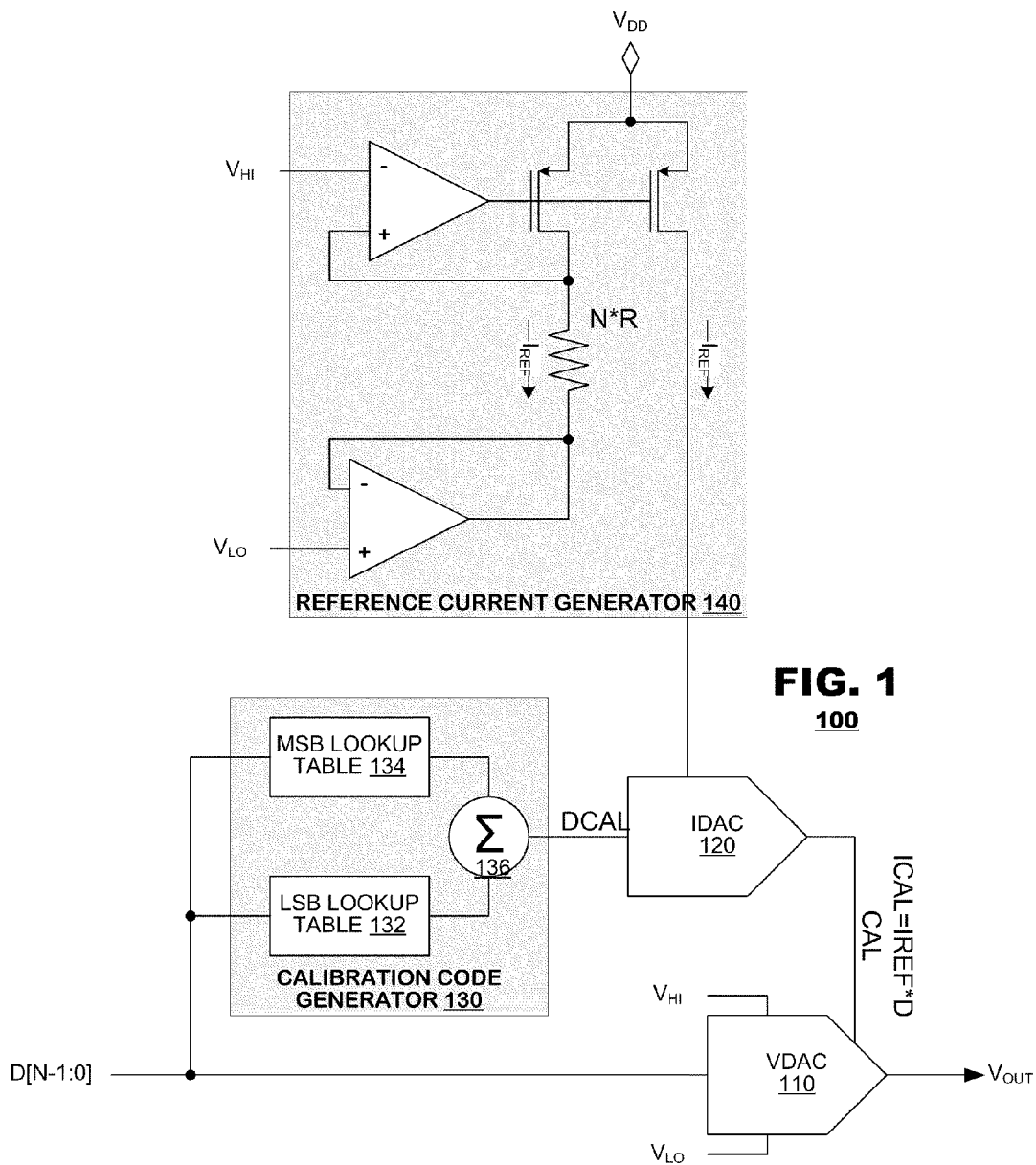
FIG. 1 is a block diagram of a current-calibrated voltage mode DAC system according to an embodiment of the present invention.

FIG. 1 depicts a block diagram of a current-calibrated voltage mode DAC system 100 according to an embodiment of the present invention. The system 100 may include a voltage mode DAC ("VDAC") 110 that may generate an output voltage $V_{OUT}$ in response to a digital input code D[N−1:0], where N=the total number of bits. The VDAC 110 may be powered by two reference voltages $V_{HI}$ & $V_{LO}$ that set the operating limits of $V_{OUT}$, whereupon $V_{HI} \geq V_{OUT} \geq V_{LO}$ and $V_{OUT}$ is a function of the digital input code, namely, $V_{OUT}=f$ (D[N−1:0]).

Figure 2:
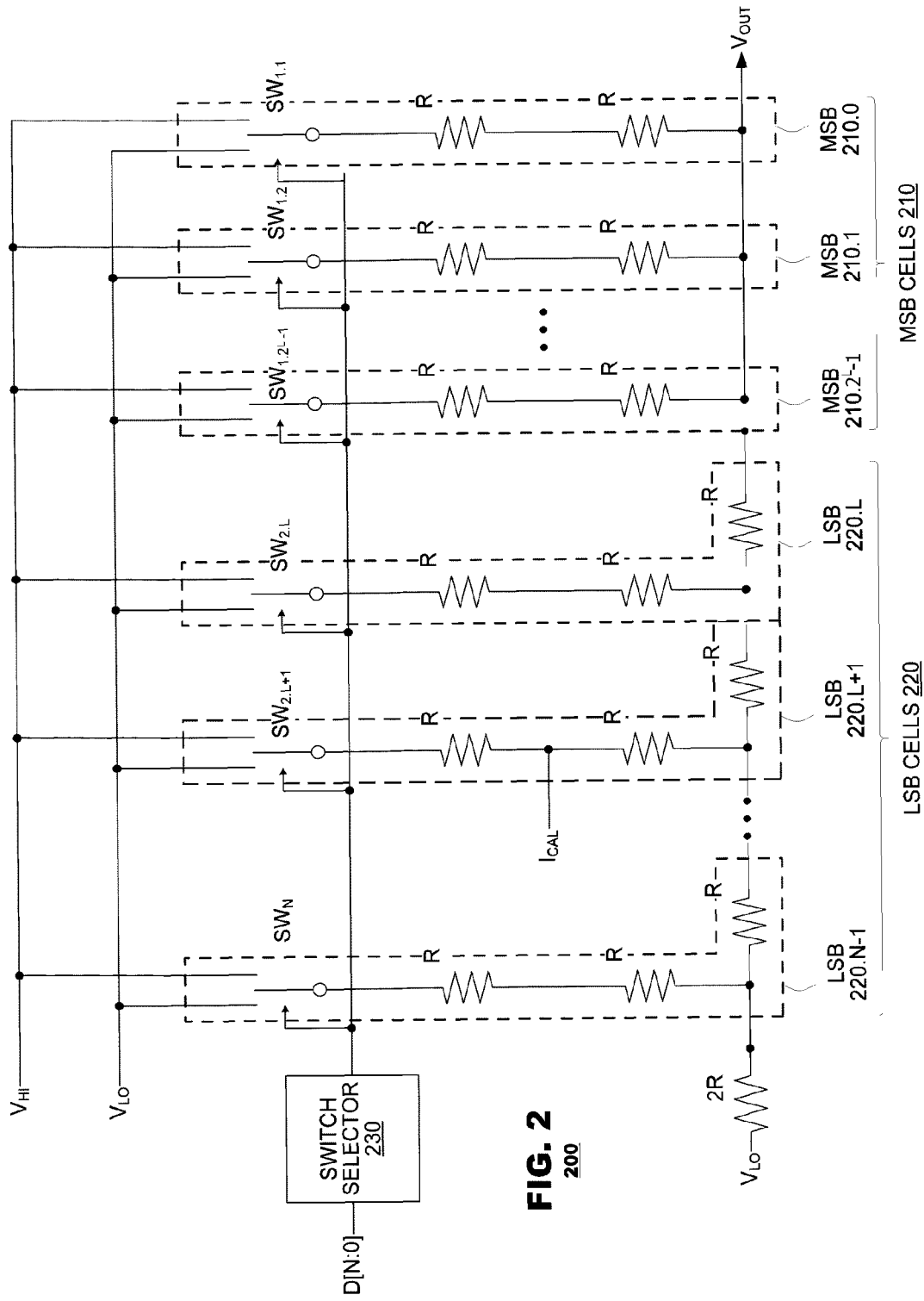
FIG. 2 is a block diagram of the voltage mode DAC according to an embodiment of the present invention.

The VDAC 110 may be made up of a segmented R-2R ladder structure, although other resistor architectures may be used. In an R-2R ladder structure architecture as shown in FIG. 2, sequences of L paths may be connected in tandem between the most significant bits ("MSBs") and LSBs. Each sequence may be comprised of an R-2R configuration where a resistor, having value R, may be connected to a resistive unit having a value of 2R, where 2R is twice the resistance of R.

The system 100 may include a current mode DAC ("IDAC") 120 that generates an output current $I_{CAL}$ in response to a multi-bit digital input code $D_{CAL}$, with $I_{CAL}$ being supplied to VDAC 110. $I_{CAL}$ represents a reference current $I_{REF}$ scaled by the calibration code $D_{CAL}$ and can be a positive or negative current. Calibration current $I_{CAL}$ may be injected into or withdrawn from VDAC 110—depending on the polarity of $I_{CAL}$—which adjusts the output voltage $V_{OUT}$ that otherwise would be obtained. VDAC 110 engages switch settings (FIG. 2 below) to set $V_{OUT}$ at an analog voltage level corresponding to the input code D.

The reference current $I_{REF}$ generated by reference current generator 140 may be supplied to IDAC 120 and may remain at a consistent level during all runtime operations, proportional to the difference between $V_{HI}$ and $V_{LO}$. Current generator 140 may contain two transistors, such as the PMOS devices shown in FIG. 1, that function as a current mirror to generate $I_{REF}$. Additionally, current generator 140 may contain two operational amplifiers configured with feedback loops that may be coupled to the transistors, with reference voltages $V_{HI}$ & $V_{LO}$ as inputs to the negative terminals of the opamps. A resistor may also be inserted as a load between the feedback loops of the two opamps.

The DAC system 100 may also include a calibration code generator 130 that generates the input code to IDAC 120 based on the input code D[N−1:0]. The calibration code generator 130 may be provided as a lookup table, embodied as a programmable ROM memory, flash memory, or other non-volatile memory device. In an embodiment, the code generator 130 may include a pair of look up tables: a first table 134 corresponding to MSBs of VDAC 110 and a second table 132 corresponding to LSBs of VDAC 110 as depicted in FIG. 1.

An adder 136 may sum the results from the two tables to generate the calibration code $D_{CAL}$, which may be sent to IDAC 120.

The lookup table may be provided in a variety of alternative ways. In certain embodiments, a single omnibus memory array may store both the MSBs and the LSBs may be ignored. In another embodiment, multiple LSB lookup tables may be implemented, whereupon each LSB lookup table may correspond to a separate LSB bit range. Using a plurality of LSB lookup tables may provide the advantage that less memory entries need to be storied overall.

In embodiments where a single MSB lookup table and a single LSB lookup table are used, a designer may select a desired number of LSBs of the input code D[N−1:0] to store. For example, in a 20-bit DAC, where the MSBs correspond to the first 6 bits, it may be convenient to provide an LSB lookup table corresponding to the next 5 bits of the input code, and choose simply to ignore the remaining LSBs.

During operation, an N bit input code D may be entered to DAC system 100. The calibration code generator 130, connected in parallel, may generate a calibration code $D_{CAL}$ based on the input code D. Calibration codes may be generated for each MSB coefficient, each of which may have its own independent correction, and therefore each code has a unique combination for each MSB segment. Correction for the LSBs is independent from the MSBs. It is a matter of design choice as to whether a designer wishes to ignore the lower bits and choose not to generate calibration codes for all LSBs. Because of the expected tolerance on the resistors implemented, it may not be necessary to calibrate for all the lower bits to achieve the desired accuracy. Choosing to calibrate for all the LSBs would necessitate an increase in the size of LSB ROM lookup table 132 to store the additional codes.

The calibration codes from MSB lookup table 134 and LSB lookup table 132 may be summed to calibration code $D_{CAL}$ and output to IDAC 120. In a configuration where only a single lookup table is used for the MSBs, the generated calibration code may be sent directly to IDAC 120. If multiple LSB lookup tables are implemented, the generated codes for all the lookup tables may be summed and then sent to the IDAC.

Resistor mismatch occurs when a circuit is manufactured, typically as an integrated circuit. Once the VDAC system 100 is manufactured, a manufacturer may cycle the system through a plurality of input codes, measure the output voltage obtained thereby, and calculate calibration codes to counteract any deviations from an ideal voltage that are observed. The derived calibration codes may be stored to the calibration code generator for run time use.

FIG. 2 is a block diagram of a VDAC 200 according to an embodiment of the present invention. The VDAC 200 may be provided as a segmented R-2R DAC, although the VDAC 200 may be made up of other resistor architectures. A segmented portion may correspond to the L most significant bits of the input code (where L≦the number of bits). In such a system, the DAC may include $2^L-1$ segments corresponding to the L MSBs of the code and N−L R-2R cells 220, corresponding to the binary weighted bits. For example, in a 20 bit DAC where L=6, there may be 63 MSB segments ($2^6-1=63$) and 14 (20−6=14) binary weighted R-2R cells.

The VDAC 200 may include a plurality of MSB segments 210.0-210.$2^L$−1. For the L most significant bits, there may be $2^L$ MSB segments. Each of the activated MSB segments may contribute to $V_{OUT}$ voltage equally, and the MSB segments correspond to the L most significant bits of the input code D[N−1:0]. Each of these segments may include resistors of magnitude 2*R, where R is a base resistance for the entire network. Each segment may also switch control to selectively couple the segment to $V_{HI}$ or $V_{LO}$. The termination of the resistors in the segment may be coupled directly to the output terminal $V_{OUT}$.

The VDAC 200 may also include a plurality of LSB cells 220.L to 220.N−1. Each cell may include three resistors of magnitude R arrayed in a 2R by R configuration. The termination of the resistors in each cell may be coupled to an intermediate node of an adjacent LSB cell. For example, LSB cell 220.L+1 may be connected to the $V_{OUT}$ terminal through a resistor R of LSB cell 220.L. Each cell may be connected to the $V_{OUT}$ terminal through any adjacent cell resistors traversed between the cell and $V_{OUT}$. A cell that is in the Mth position, where M is the order among the binary weighted cells removed from the $V_{OUT}$ terminal, may be connected to the $V_{OUT}$ terminal via M R magnitude resistors of intermediate cells.

Each cell may also switch control to selectively couple the cell to $V_{HI}$ or $V_{LO}$. Each cell may be activated by switch selector 230 that decodes the input code D[N−1:0] and selects individual cells to be activated. Each LSB cell, when activated, may contribute to the output voltage in a manner that may correspond to the cell's position in the circuit and the number of adjacent cell resistors that are traversed between the activated cell and the output terminal. For example, if LSB cells 220.L and 220.L+1 were activated, cell 220.L+1 would contribute half as much to $V_{OUT}$ as cell 220.L. Similarly, LSB cell 220.L contributes half as much to $V_{OUT}$ as an activated MSB segment 220.1. Thus, the contributions of the LSB cells may decline according to a binary weighting relationship based on each cell's position.

The plurality of resistors R present in the MSB segments and LSB cells are the sources of the non-linearities to be corrected by the calibration current. When fabricated in an integrated circuit, each resistor may deviate from the ideal resistance R by an independent offset. Each of the errors of each MSB segment is independent of the errors of the other MSB segments. Additionally, each of the errors of each LSB cell also is independent of each other. Contributions of resistor errors at LSB cells far removed from the output terminal may be attenuated sufficiently that it may not be necessary to correct them in all cases.

In an embodiment, $I_{CAL}$ may be injected into one of the LSB cells (shown in FIG. 2 as 220.L+1) for calibration purposes. The selection of where to inject the calibration is a design choice that can be determined by a circuit designer, and $I_{CAL}$ may be varied by changing the injection point in the VDAC. The calibration current $I_{CAL}$, which as noted may represent the reference current $I_{REF}$ scaled by $D_{CAL}$, may induce a change in $V_{OUT}$ ($\Delta V_{OUT}$) which may be modeled by the formula:

$$\Delta V_{OUT} \propto \frac{I_{CAL}}{2^{POS}} = \frac{D_{CAL} * I_{REF}}{2^{POS}},$$

where POS represents the position of the cell in which the $I_{CAL}$ is injected.

The calibration current may alternatively be introduced into an MSB segment, and introducing the current into either an LSB cell or MSB segment causes corresponding adjustments to the voltage at the output node $V_{OUT}$ in accordance with the above formula. As shown, the contribution of calibration current on the output $V_{OUT}$ may be attenuated based on the LSB cell position in the R-2R network or dependent on which MSB segment is selected. Circuit designers have several degrees of freedom to tailor the calibration current to satisfy their individual needs. Introducing the calibration current nearer to $V_{OUT}$, such as into one of the MSB segments, may result in a larger voltage swing at the output terminal and change in the voltage at $V_{OUT}$ than introducing the calibration current in a LSB cell positioned far from the $V_{OUT}$. This may be desirable in the event that it is intended to correct for bigger errors and permits circuit designers to provide IDACs that generate relatively large currents without saturating $V_{OUT}$, although this may not generally be needed. A selection of an injection point further from the output terminal may allow for a more accurate correction of smaller errors. Parameters $I_{REF}$, $D_{CAL}$ and POS each may be varied during circuit design to match a target maximum $\Delta V_{OUT}$ level.

In an embodiment, the selection of the injection point is made so that $I_{CAL}$ may be approximately 10 µA, and thus a selection of an injection point half-way through the binary weight LSB cells may be preferable and done to achieve this desired current.

Figure 3:
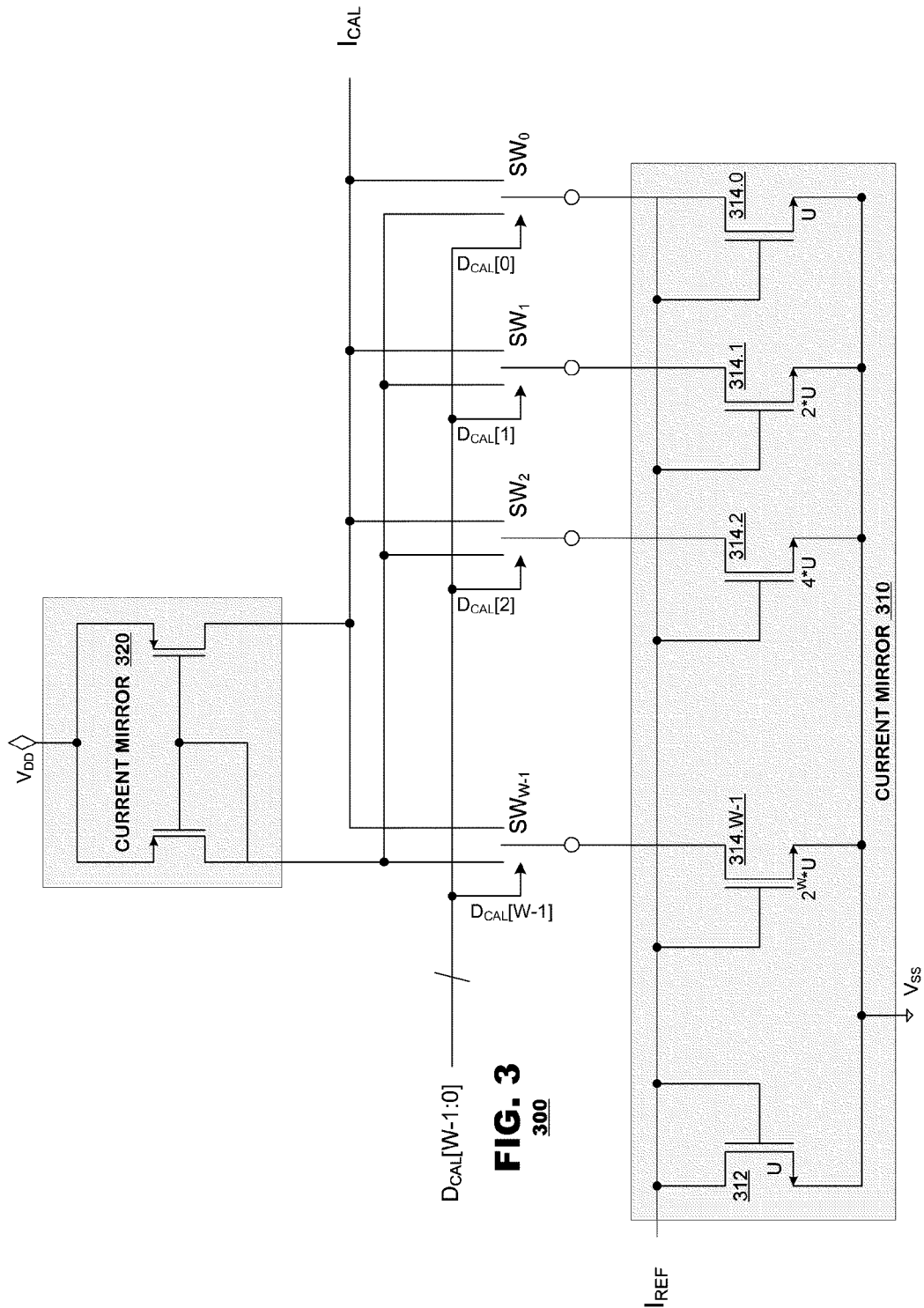
FIG. 3 illustrates a current mode DAC according to an embodiment of the present invention.

FIG. 3 is a block diagram of an IDAC 300 according to an embodiment of the present invention. FIG. 3 depicts just one configuration of an IDAC and alternative configurations may be used. IDAC 300 may accept a calibration code $D_{CAL}$ of width W ($D_{CAL}$[W-1:0]) and a reference current $I_{REF}$, and generate a calibration current $I_{CAL}$ representing the reference current scaled by the calibration code.

The IDAC 300 may include current mirror 310 having W transistors. The current mirror 310 may have a first transistor 312 which has a unit size (U). Current mirror 310 may also include a plurality of transistors, 314.0-314.W-1, which may be selectively switched between the output terminal ($I_{CAL}$) and current mirror 320. Each corresponding transistor 314.i may correspond to a bit position in the calibration code ($D_{CAL}$[i]) and the size of each transistor 314.i may correspond to the unit size (U) scaled according to the bit position of the respective transistor. For example, transistor 314.i, corresponding to $D_{CAL}$[i], may have a size $2^i*U$. Therefore transistors 314.0-314.W-1 carry current that is a binary scaling of the reference current based on the transistor's corresponding position in the calibration code (where for example, transistor 314.i may carry current $2^i*I_{REF}$). In an embodiment, transistors 312 and 314.0-314.W-1 may be selected to be n-type MOSFETs as shown in FIG. 3.

The IDAC 300 may also include a second current mirror 320. The current mirror 320 may contain at least two transistors coupled together. In an embodiment, the transistors in current mirror 320 may be selected to be p-type MOSFETS. Transistors 314.0-314.W-1 may switchably be connected to current mirror 320 and the output terminal through switch network $SW_0$-$SW_{W-1}$. Each switch $SW_i$ may correspond to a bit position in the calibration code ($D_{CAL}$[i]) and may be connected to the corresponding transistor 314.i. Each switch $SW_i$ may also connect the corresponding transistor 314.i to the output terminal or to current mirror 320.

The transistor 312 may receive the inputted reference current $I_{REF}$ through the drain of the transistor. Alternatively, transistor 312 may be scaled by some factor G so that it has size G*U. In embodiments where G>1, operation of the circuit is the same as described previously, except there is a decrease in the magnitude of the calibration current $I_{CAL}$ compared to the reference current $I_{REF}$. This avoids the need for a very small reference current, which is problematic as it can be more difficult to generate accurately in an integrated circuit.

Transistors 314.0-314.W-1 may be sized as to produce binary weighted currents as shown in FIG. 3. Each of the successive switched transistors may be sized to produce a current that is twice as much as the previous switched transistor (e.g. 1 µA, 2 µA, 4 µA, up to $2^W$ µA). These resulting currents may be scaled with the reference current and contribute to the change in current at the output, $I_{CAL}$.

Current mirrors 310 and 320 may act to change the polarity and magnitude of the output current. Current mirror 310 may be designed to pull current down through the transistors. Conversely, when transistors 314.0-314.W-1 are connected to current mirror 320, current may be pulled up and effectively added to the output current. In a first switch position for switch network $SW_0$-$SW_{W-1}$, the current through the corresponding transistor 314.i may be added to the current at the output terminal. In a second switch position, the current through the corresponding transistor 314.i may be subtracted from the current at the output terminal.

As each of the switched transistors may be sized to produce binary weighted current, the amount that each switched transistors contributes to the output varies. Due to switch state changes, the calibration current may vary between $+2^W*I_{REF}$ to $-2^W*I_{REF}$ based on the $D_{CAL}$ calibration code [W-1:0]. In an example where $D_{CAL}$ is an 8-bit code (thus $D_{CAL}$[7:0]), after $I_{REF}$ is scaled with $D_{CAL}$ the swing in the calibration current is the interval $+128*I_{REF} \leq I_{CAL} \leq -128*I_{REF}$.

What is claimed is:

1. A digital to analog converter, comprising:
   a voltage mode DAC (VDAC) having an input for a digital codeword to be converted;
   a calibration code generator having an output for a calibration code generated in response to the digital codeword; and
   a current mode DAC (IDAC) to output a calibration current to the VDAC based on the calibration code.

2. The digital to analog converter of claim 1, wherein the calibration code generator includes a memory programmed with calibration codes to counteract non-linear behavior of default operation of the VDAC.

3. The digital to analog converter according to claim 1, wherein the VDAC is connected to a high and a low reference voltage.

4. The digital to analog converter according to claim 3, wherein the low reference voltage is ground.

5. The digital to analog converter according to claim 3, wherein the high and low reference voltage denote two endpoints of a desired transfer function.

6. The digital to analog converter according to claim 1, wherein the VDAC comprises of a R-2R resistor ladder structure.

7. The digital to analog converter according to claim 6, wherein the R-2R resistor ladder structure has a plurality of segmented bits and a plurality of binary weighted bits.

8. The digital to analog converter according to claim 7, wherein the calibration current is injected into one of the segmented bits or binary weighted bits.

9. The digital to analog converter according to claim 1, wherein the calibration code generator houses a read only memory (ROM) lookup table to store calibration values indexed by most significant bits (MSBs) and least significant bits (LSBs) of the digital bit codeword.

10. The digital to analog converter according to claim 1, wherein the calibration code generator houses at least one most significant bit (MSB) read only memory (ROM) lookup table to store calibration values indexed by most significant bits (MSBs) of the digital bit codeword.

11. The digital to analog converter according to claim 10, wherein the calibration code generator houses a least significant bit (LSB) read only memory (ROM) lookup table to store calibration values indexed by least significant bits (LSBs) of the digital bit codeword.

12. The digital to analog converter according to claim 11, further comprising of an adder that sums the values of the MSB ROM lookup table and the LSB ROM lookup table and outputs the resulting calibration code to the IDAC.

13. The digital to analog converter according to claim 10, wherein the calibration code generator houses a plurality of least significant bit (LSB) read only memory (ROM) lookup tables to store calibration values indexed by least significant bits (LSBs) of the digital bit codeword.

14. The digital to analog converter according to claim 13, further comprising of a plurality of adders that sum the values of the LSB ROM lookup tables resulting in an aggregate value for the LSBs.

15. The digital to analog converter according to claim 14, further comprising of a second level adder that sums the values of the MSB ROM lookup table and the aggregate value for the LSBs and outputs the resulting calibration code to the IDAC.

16. The digital to analog converter according to claim 1, wherein the IDAC is biased by a reference current generator.

17. A digital to analog converter, comprising:
a voltage mode DAC (VDAC) having an output voltage;
a current mode DAC (IDAC) that outputs a calibration current to calibrate the output voltage of the VDAC;
a most significant bit (MSB) read only memory (ROM) lookup table that stores calibration values indexed by most significant bits of the digital bit codeword;
a least significant bit (LSB) read only memory (ROM) lookup table that stores calibration values indexed by least significant bits of the digital bit codeword; and
an adder that sums the values of the MSB ROM lookup table and the LSB ROM lookup table and generates a resulting calibration code that is supplied to the IDAC.

18. The digital to analog converter according to claim 17, wherein a reference current generator outputs a reference current to bias the IDAC.

19. The digital to analog converter according to claim 18, wherein the reference current is proportional to a difference between a high and a low reference voltage connected to the VDAC.

20. The digital to analog converter according to claim 17, wherein the calibration current is based on the resulting calibration code.

21. A method for performing digital to analog conversion, comprising:
inputting a digital codeword to a voltage mode digital to analog converter (VDAC);
retrieving a calibration code based on the digital codeword, the calibration code having been generated and stored via a test process performed on the VDAC to detect non-linear performance of the VDAC in response to input codewords;
generating a calibration current based on the calibration code; and
injecting the calibration current into the VDAC as the VDAC processes the digital codeword.

22. The method according to claim 21, wherein the VDAC comprises of a R-2R resistor ladder structure having a plurality of segmented bits and a plurality of binary weighted bits.

23. The method according to claim 22, wherein the calibration current is injected into one of the segmented bits or binary weighted bits.

24. The method according to claim 21, wherein a plurality of calibration values indexed by most significant bit (MSB) of the digital codeword are retrieved from a MSB ROM table.

25. The method according to claim 24, wherein a plurality of calibration values indexed by least significant bit (LSB) values of the digital codeword are retrieved from at least one LSB ROM table.

26. The method according to claim 25, wherein the MSB values and the LSB values are summed in an adder.

27. A method for calibrating operation of a voltage mode digital to analog converter (VDAC) manufactured in an integrated circuit, the method comprising, for each of a plurality of candidate codewords:
inputting the candidate codeword to the VDAC;
comparing an output of the VDAC to an idealized response of the VDAC based on the candidate codeword;
identifying a calibration current to be injected into the VDAC to cause the VDAC's output to match the idealized response; and
storing a codeword corresponding to the calibration current in a memory device on the integrated circuit associated with the VDAC.

* * * * *